(12) United States Patent
Chapman et al.

(10) Patent No.: US 7,315,380 B2
(45) Date of Patent: Jan. 1, 2008

(54) LASER INTERFEROMETER FOR REPEATABLE MOUNTING ON THE WALL OF A VACUUM CHAMBER

(75) Inventors: Mark Adrian Vincent Chapman, Wotton-under-Edge (GB); William Ernest Lee, Bristol (GB); Martin Jonathan May, North Woodchester (GB)

(73) Assignee: Renishaw, PLC, Gloucestershire (GB)

( * ) Notice: Subject to any disclaimer, the term of this patent is extended or adjusted under 35 U.S.C. 154(b) by 288 days.

(21) Appl. No.: 11/089,007

(22) Filed: Mar. 24, 2005

(65) Prior Publication Data

US 2005/0225770 A1 Oct. 13, 2005

Related U.S. Application Data

(63) Continuation-in-part of application No. PCT/GB03/04361, filed on Oct. 3, 2003.

(30) Foreign Application Priority Data

Oct. 4, 2002 (GB) ................... 0222970.6

(51) Int. Cl.
*G01B 9/02* (2006.01)
(52) U.S. Cl. ...................... 356/450; 356/493; 356/482; 356/500; 356/513
(58) Field of Classification Search ................ 356/53, 356/493, 482, 500, 513, 450; 438/7
See application file for complete search history.

(56) References Cited

U.S. PATENT DOCUMENTS

| 4,865,453 | A | * | 9/1989 | Gidon et al. ................. 356/482 |
| 5,550,633 | A | | 8/1996 | Kamiya |
| 6,473,250 | B1 | * | 10/2002 | Chapman et al. ........... 359/837 |
| 6,539,044 | B1 | | 3/2003 | Kuzuta |
| 2001/0006413 | A1 | | 7/2001 | Burghoorn |
| 2002/0047542 | A1 | | 4/2002 | Higuchi |
| 2003/0144819 | A1 | * | 7/2003 | Takeuchi et al. ............ 702/189 |

FOREIGN PATENT DOCUMENTS

| CN | 1176507 A | 3/1998 |
| JP | A-2000-088512 | 3/2000 |
| WO | WO 00/57228 A2 | 9/2000 |
| WO | WO 2004/031816 A2 | 4/2004 |

OTHER PUBLICATIONS

H.J.J. Braddick; "Mechanical Design of Laboratory Apparatus"; Chapman and Hall Ltd.; pp. 1-31; 1960.

* cited by examiner

*Primary Examiner*—Layla G. Lauchman
*Assistant Examiner*—Abdullahi Nur
(74) *Attorney, Agent, or Firm*—Oliff & Berridge, PLC

(57) ABSTRACT

A laser interferometer is disclosed comprising a housing capable of being substantially repeatably mounted to a wall of an environmental chamber, the housing including a laser source, a reflector attached to an object located within the environmental chamber, and a light passage provided through the wall of the environmental chamber enabling passage of a laser beam from the laser source to the reflector. At least one beam steerer may be provided for adjusting direction of passage of a laser beam through the light passage. Also disclosed is a column laser interferometer.

13 Claims, 5 Drawing Sheets

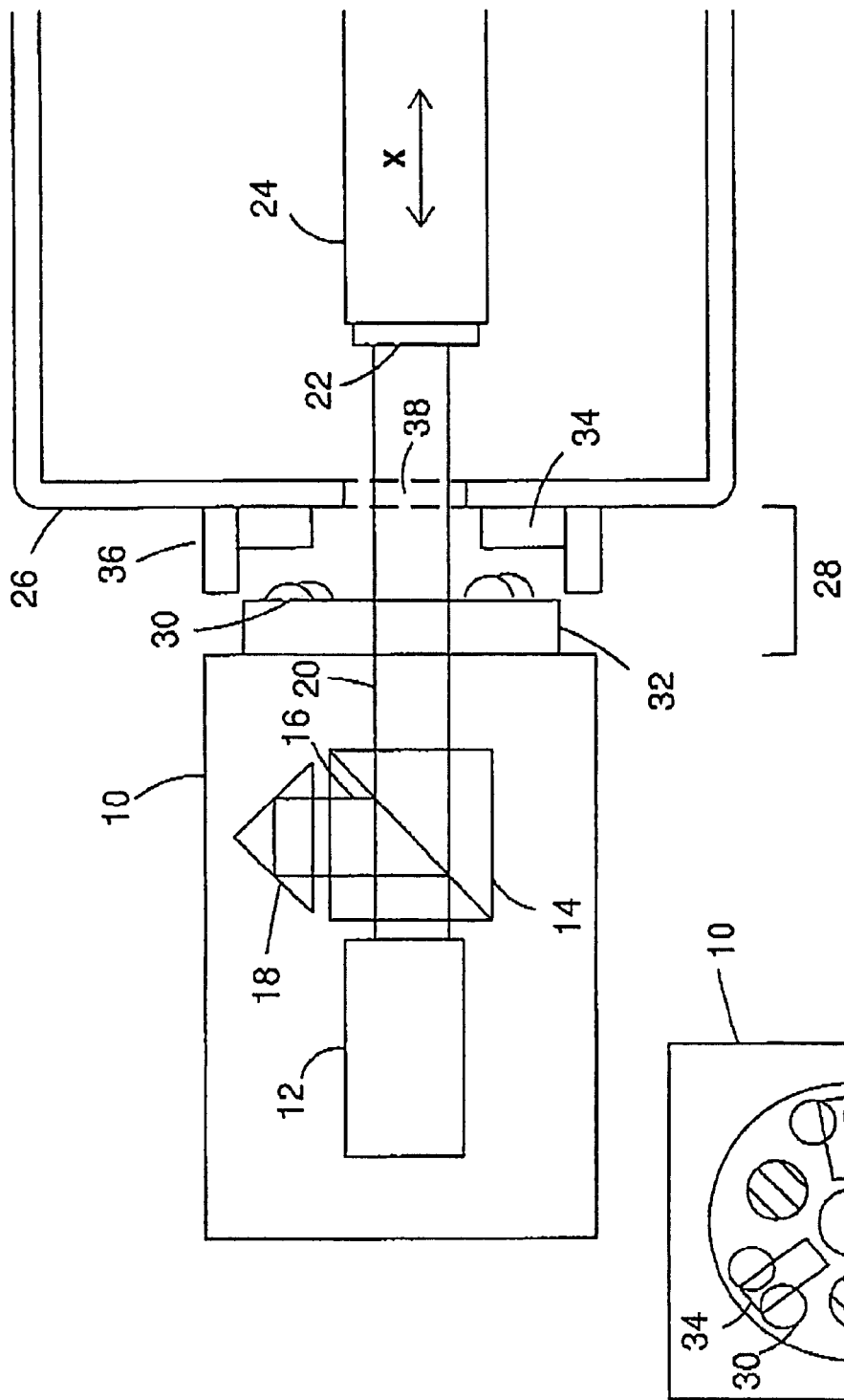

LASER INTERFEROMETER FOR REPEATABLE MOUNTING ON THE WALL OF A VACUUM CHAMBER

Figure 3:
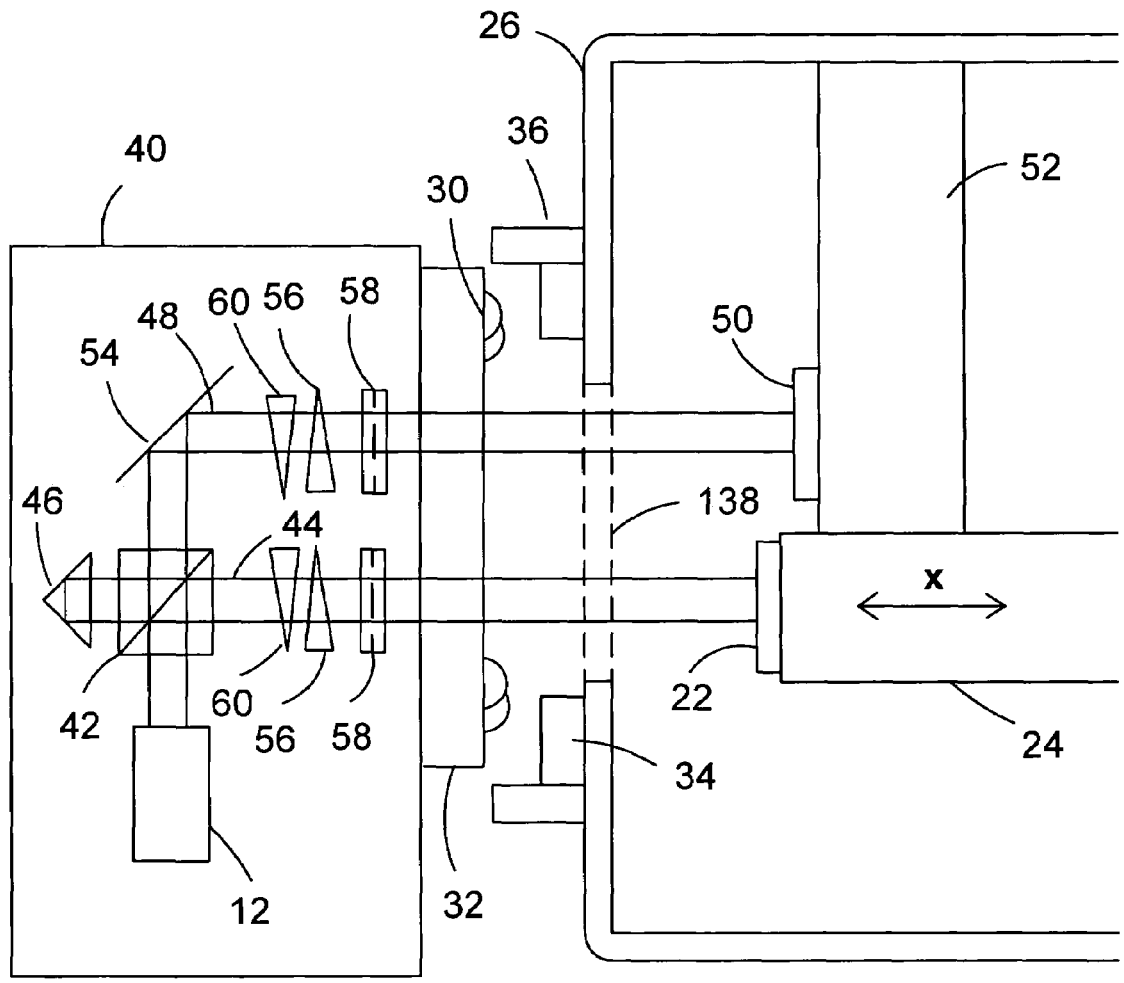

This is a Continuation-in-Part of International Application No. PCT/GB03/04361 filed Oct. 3, 2003, which claims the benefit of British Application No. 0222970.6.1 filed Oct. 4, 2002. The entire disclosure of the prior applications is hereby incorporated by reference herein in its entirety.

This invention relates to a laser interferometer.

Environmental control chambers are demanding locations for any equipment and components within said equipment must be able to withstand high or low pressures, organic gases and, where chamber contamination is an issue, temperatures of 150° C. and higher. Traditional laser interferometer systems cannot meet these requirements. One situation where environmental control is required is in semiconductor manufacture for, for example, manufacture of computer chips and their masks where a clean environment is paramount.

According to a first aspect of the invention there is provided a laser interferometer comprising:
 a housing capable of being substantially repeatably mounted to a wall of an environmental chamber, the housing including a laser source;
 a reflector attached to an object located within the environmental chamber; and
 a light passage provided through the wall of the environmental chamber enabling passage of a laser beam from the laser source to the reflector.

Preferably, a detector is provided within the housing.

The laser source may be a laser or the end of a fibre optic link to a laser.

According to a second aspect, the invention provides a laser interferometer comprising:
 a laser source for providing a first laser beam;
 means to provide a second laser beam;
 interference means to provide an interference beam from the super position of the first and second laser beams;
 a detector for detecting the interference beam; and
 a reflector attached to an object which is movable relative to the laser source for reflecting at least one of the laser beams from the object to the interference means;
 wherein at least the reflecting means is provided within an environmental chamber and at least the laser source is provided external to the vacuum chamber via a housing capable of being substantially repeatably mounted to a wall of the environment chamber and a light passage is provided through the wall of the vacuum chamber enabling passage of the at least one laser beam therethrough.

The walls of the environmental chamber can distort during (de)pressurisation, or baking out of the chamber. This can damage sensitive components of the interferometer. Additionally, the distortion may cause misalignment of a laser beam so, it is advantageous that the locating joint is designed such that the correct and accurate repeatable location is provided when the environmental chamber is under conditions of use.

The housing is mounted to the chamber wall with sufficient repeatability (it is substantially repeatably mounted) for at least the minimum signal strength to be detected. This enables realignment of the laser beam using a signal strength meter to achieve optimum signal strength thus, absolute repeatability is not essential.

An environmental chamber includes any chamber which may be commonly called a vacuum chamber in which seals that are capable of withstanding a partial or full vacuum are used either to prevent ingress or egress of gases. Such a chamber may be used in a total vacuum, partial vacuum, the absence of air, for example when processing gases such as oxygen or organic gases are used, or even at pressures of greater than one atmosphere.

In order that deviations in beam alignment can be catered for, it is preferred that at least one beam steerer is provided. Preferably, at least two beam steerers, each for a plane perpendicular to the beam direction, is provided. The beam steerer(s) adjust the direction of passage of a laser beam through the light passage. The beam steerers may comprise wedge prisms and/or mechanical adjusters. Where at least two wedge prisms are provided, they are preferably unmatched.

Figure 4:
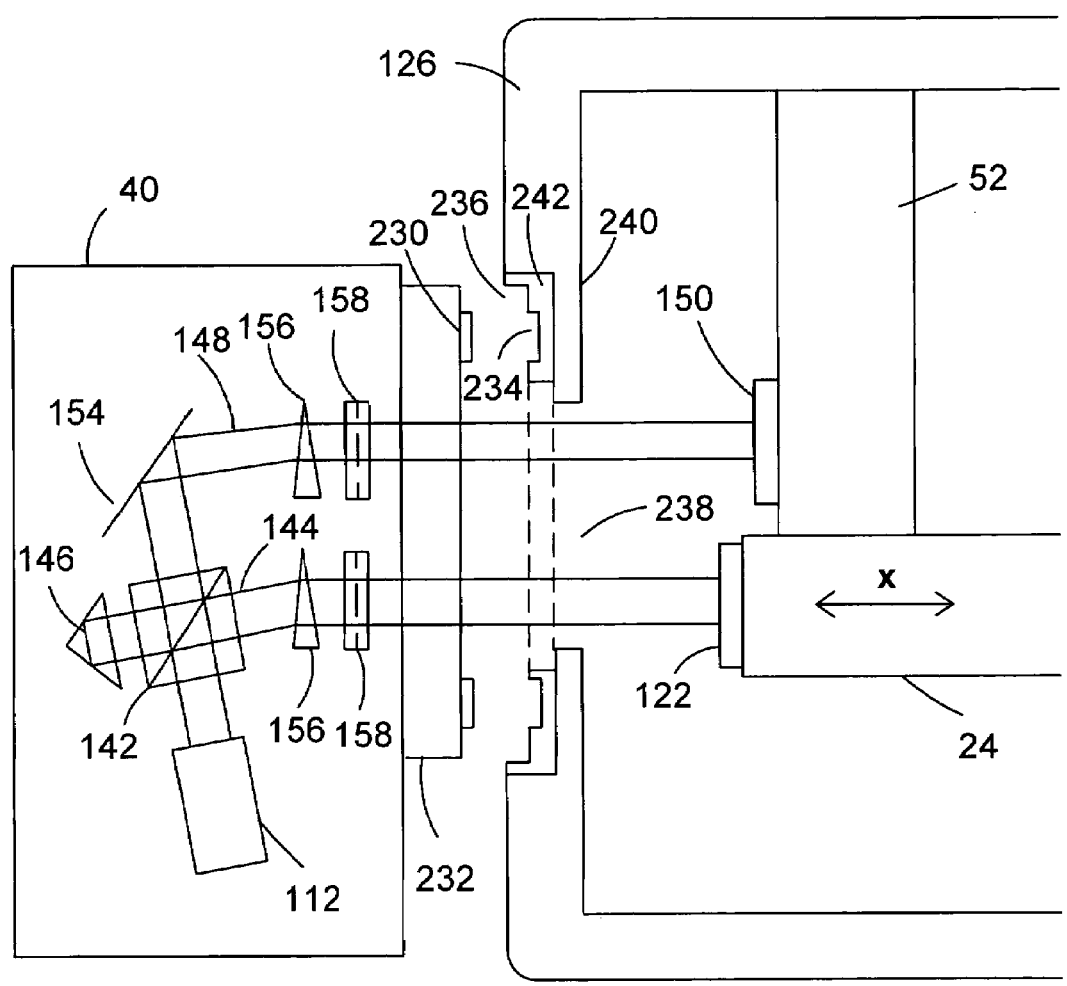
Figure 6:
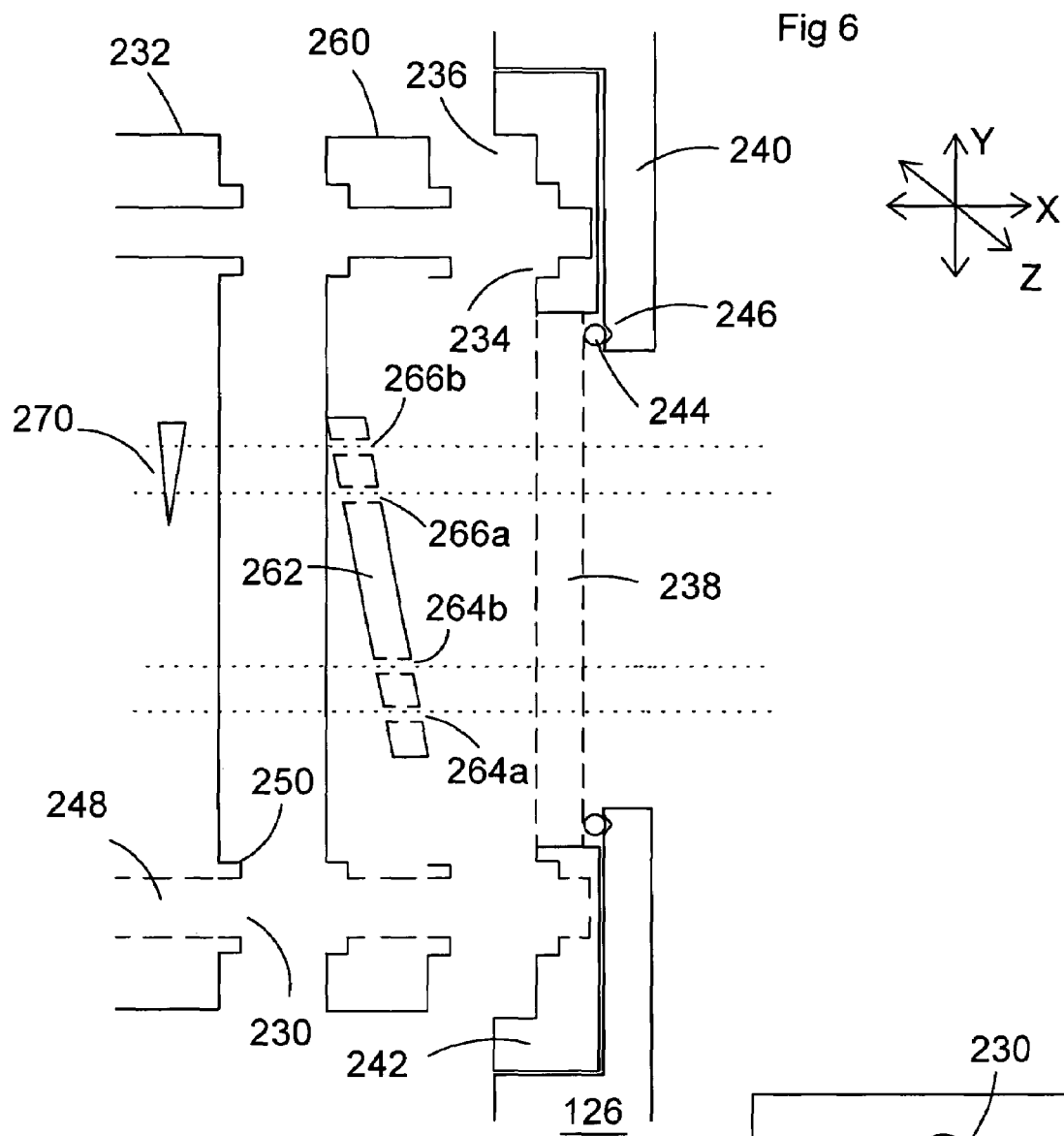
Figure 5:
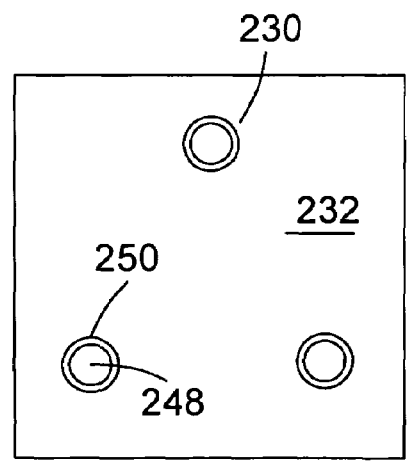
Figure 7:
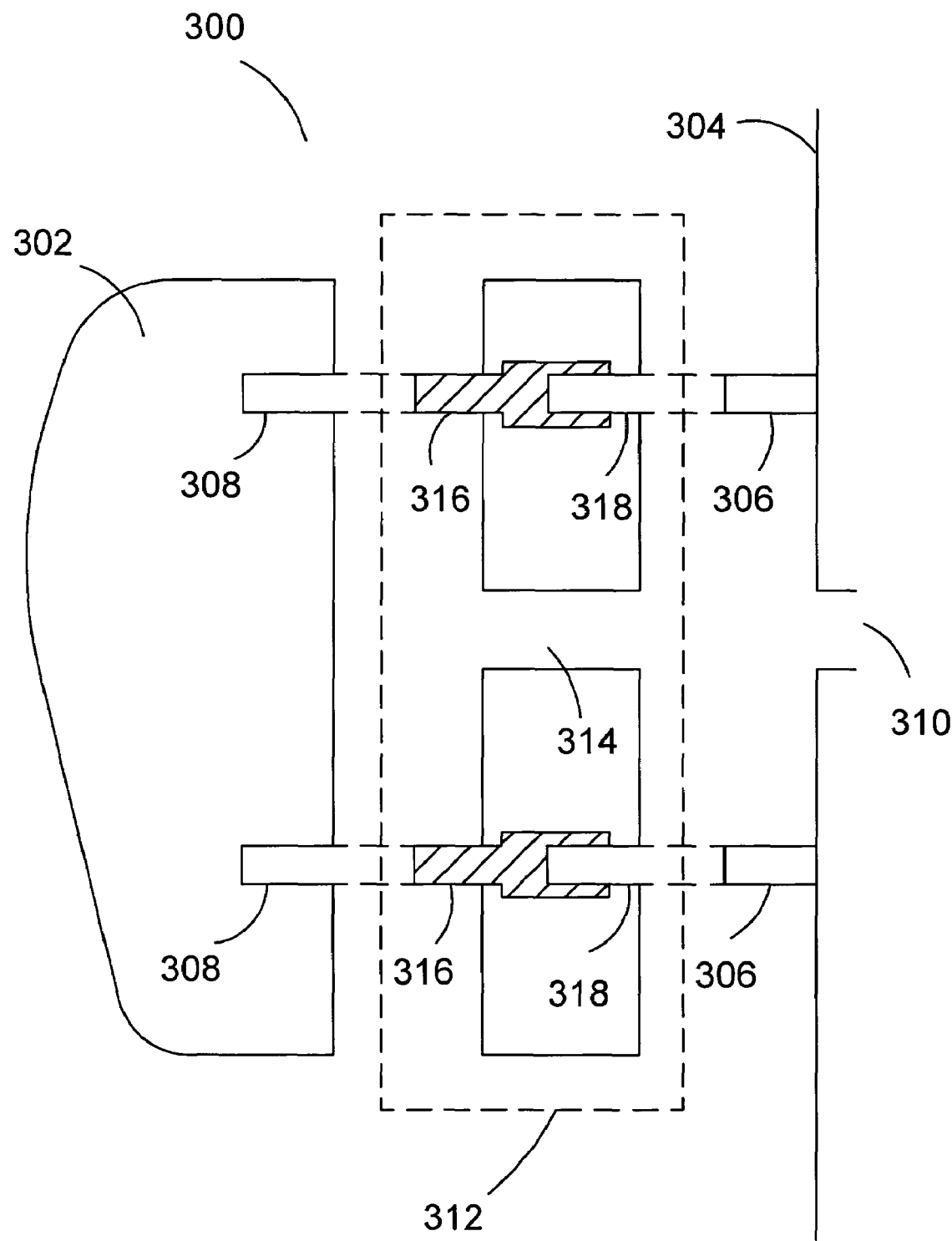

The invention will now be described by way of example and with reference to the accompanying drawings of which:

FIG. 1 is a plan view of an interferomic system according to the invention;
 FIG. 2 is a view of the mount shown in FIG. 1;
 FIG. 3 is an alternative laser interferometer system according to the invention;
 FIG. 4 is a further laser interferometer system according to the invention;
 FIG. 5 is an end view of the mount shown in FIG. 4;
 FIG. 6 is a cross-section through the laser interferometer shown in FIG. 4; and
 FIG. 7 is a schematic of a laser interferometer according to the invention.

FIG. 1 shows a detachable object 10 which comprises a combined laser source and detection system 12, a polarising beamsplitter 14 which splits a beam from the laser source 12 into a reference beam 16 and a measurement beam 20. The reference beam 16 is directed towards a retroreflector 18 and then back to the polarising beamsplitter 14 and the detector 12. The measurement beam 20 is incident on a vacuum compatible plane mirror 22 mounted on a movable stand 24 which is housed within a vacuum chamber 26 and is movable towards and away from the laser source (in the x direction). The measurement beam 20 enters and leaves the vacuum chamber 26 via an optical window 38. The detachable object 10 is retained on a wall of the vacuum chamber 26 via a kinematic mount 28.

The kinematic mount 28 comprises three pairs of spaced-apart balls 30 which are mounted in a protruding section 32 of the detachable object 10 (see FIG. 2 for a clearer view of the kinematic locator). Mounted on the vacuum chamber 26 are three rods 34 which are spaced-apart such that one rod corresponds to the centre of a pair of balls 30. A sleeve 36 extends out from the wall of the vacuum chamber 26 which houses the protrusion 30 on the detachable object 10. The sleeve 36 and rods 34 are securely mounted to the wall of the vacuum chamber, with enough freedom to accommodate any vacuum chamber wall distortion during heating or when a vacuum is pulled but, rigidly enough that it remains fixed with respect to the wall and plane mirror 22 to allow repeatable positioning of the detachable object 10 maintaining the optical path therebetween and to provide a stable mounting position with respect to the movable stand during the measuring process. If a number of different vacuum strengths are used, then the mounting may require adjustment to account for variations in wall flexing.

Referring now to FIG. 2, at the centre of the kinematic joint there is provided an aperture 39 which is in line with the optical window 38 in the vacuum chamber and the plane mirror 22 and this allows the measurement beam to be incident on and reflected by the plane mirror 22.

On movement of the sample stage 24 onto which, for example, a semi-conductor wafer can be placed, the interference between the measurement beam 20 and reference beam 16 as measured by the laser detector 12 will change thus enabling the relative positions of the movable sample holder 24 and the detachable object 10 to be known.

The kinematic joint 28 is held in position by three spaced-apart magnets 37 which lie disposed between the pairs of balls on the protrusion 30 of the detachable object 10. This means that either the vacuum chamber wall must be made from a magnetic material or, that the sleeve 36 and rod 34 mounting requires a thin metallic base.

One of the advantages to having a detachable object which houses the laser source, detector and associated optics is that it allows removal of the detachable object during evacuation of the vacuum chamber as well as baking out of a chamber. This prevents any fragile components of the laser interferometer from being damaged, distorted or otherwise affected by the adverse conditions within the vacuum chamber.

The type of kinematic joint described above is preferred, but other kinematic seating arrangements and biasing methods may be used in place of magnets. Alternative kinematic arrangements are described in "Mechanical Design of Laboratory Apparatus" by H Braddick, Chapman and Hall Limited, London 1960. One example of an alternative bias is to use a spring, which may be a tension or a compression spring depending on how the joint is engineered.

The repeatable location does not have to be kinematically constrained it is sufficient that the location of the laser source with respect to the reflecting mirror is repeatable. One alternative is to use a sliding plate onto which the laser interferometer components which are external to the vacuum chamber are mounted. This is then located in a corresponding "u"-shaped mount provided on a wall of the vacuum chamber. Accurately positioned screws could be used to ensure repeatability of the location of the sliding plate within the mount.

In order to make the conditions of the reference and measuring beam routes as similar as possible, the reference beam route may be provided with a piece of glass between the retroreflector 18 and beamsplitter 14 which is of the same thickness and composition as the optical window 38. This accounts for changes in path length as the temperature of the system changes due to glass expansion/contraction.

FIG. 3 shows a column laser interferometer system having a detachable object 40 which includes a combined laser source and detection system 12 and a beamsplitter 42 which splits a laser beam from laser source 12 into a measurement beam 44 and a 48 reference beam. In this case the beamsplitter 42 is a polarising beamsplitter to produce a double-pass interferomic system. The measurement beam 44 is incident on the retroreflector 46 which directs it toward a plane mirror 22 mounted on a movable sample holder 24 within the vacuum chamber 26. The reference beam 48 is incident on a 45° mirror 54 which directs the beam toward a plane mirror 50 mounted on a column reference 52 which is relatively fixed in relation to the movable sample holder 24. The position of the column reference 52 is fixed with respect to the rest of the interferomic system when the interferomic system is kinematically located. Movement of the sample stage 24 will introduce a change in the path length between the measurement beam 44 and the reference beam 48 which is detected by the detector 12. Thus the position of the sample stage 24 can be calculated accurately. A vacuum window 138 located in a wall of the vacuum chamber 26 is of sufficient size to allow passage of the reference beam 48 to the second reflector 50 in addition to passage of the measurement beam 44.

In this example the combined laser source and detector is substantially perpendicular to the plane mirrors 22, 50. This reduces the length of the detachable object 40 in the x direction which means that the strain on and thus strength required by the kinematic joint is reduced and the chance of accidental removal of the detachable object 40 is reduced.

A trio of prisms 56, 58, 60 lies in the path of the measuring beam 44 and the reference beam 48. Rotation of two of the prisms 56, 58 causes deviations of beam direction of the measurement or reference beam to their respective plane mirrors 22, 50. This enables manufacturing errors in the alignment of the optical components to be compensated for. Two rotatable prisms could be used but they would have to be a matched pair, which increases costs. An alternative to a 45° mirror 54 is a pentaprism. The use of three prisms to effect beam deviation in two planes is described in more detail in U.S. Pat. No. 6,473,250.

FIG. 4 shows an alternative column interferometer system to that shown in FIG. 3. In this example, the combined laser source and detector 112, beamsplitter 142 and retroreflector 146 are all located at a near but non-perpendicular angle to the plane mirrors 122, 150 (when attached to the chamber). The mirror 154 which reflects the reference beam 148 towards plane mirror 150 is not at 45° to the incident reference beam 148. The mirror 154 is tilted with respect to the reference beam 148 in two planes. The use of such an off-axis laser system means that instead of using two matched prisms or three prisms as with a perpendicular aligned laser, two matched or unmatched rotatable prisms 156, 158 may be used for beam alignment.

The two prisms 156, 158 each have restricted rotational motion in relation to the beam path. For example, the prisms are restricted to 90° rotation about the beam path, thus rotation of each prism causes deviation of the laser beam in a different plane. The use of two such prisms is not limited to the situation described wherein the laser source is positioned almost perpendicularly to the mirror, the laser source may be at an oblique angle to the mirror. This off-axis embodiment is described in more detail in co-pending application WO2004/031816.

The use of two rotatable prisms for 2-dimensional beam deviation has a further use. In processes where sample positioning is important, any angular deviation of that sample is undesirable. So, in addition to enabling sample positioning to be measured, embodiments of the invention utilising two rotating prisms (or their equivalents) also enable the angular movement of the sample stage to be tracked during a linear movement. As the interference beam must be detected at all times during a measurement process, a certain angular misalignment will be tolerated before loss of signal, which is one way to show that there is angular movement. However, if the prisms are rotated in order to counteract these angular deviations of the sample stage, then the amount of angular deviation can be calculated by monitoring the degree of rotation and, perhaps, rate of rotation. If the prisms are motorised, then the angular deviations can be auto-tracked. If a certain angular deviation can be tolerated, this tracking technique could even be used during a measurement to indicate that the sample stage is going out of tolerance.

It is not necessary to use two wedge prisms. For example, the mirror may be offset to the required beam direction in only one plane, in which case a single bean steerer may be used. The wedge prisms may be replaced by alternative optical elements or mechanical adjusters such as an adjustable clamp as is described in International Published Application WO00/57228.

The repeatable mount shown in FIG. 4, will now be described referring to FIGS. 4,5 and 6. Three spaced apart locators 230 are provided on a protruding section 232 of the detachable object 40. The chamber wall 126 has a recessed zone 240 which houses a mounting plate 242. The mounting plate 242 includes a recess 236 which corresponds to the size and shape of the protrusion 232 of the detachable object. The mounting plate recess 236 also includes three locator recesses 234 which correspond to the size and relative positions of the three locators 230 and house the locators therein.

Referring now to FIG. 6, the mounting plate 242 incorporates a window 238 which allows the passage of light from a laser source 112 to a reflector 122, 150. The mounting plate 242 is sealed against the chamber wall 126 by an o-ring 244 located in a groove 246 in the chamber wall 126. Conveniently, the o-ring 244 seals against the window 238.

The locators 230 include a central bore 248 through which a bolt (not shown) passes and an external lip 250 which co-operates with the appropriate locator recess 234 providing approximate location of the detachable object 40 with respect to the chamber wall 126. When the detachable object is bolted in place via the locators, rotation of rotatable prisms 156 and 158 (FIG. 4) aligns the laser beam 144, 148 onto the mirrors 122, 150 and back to the detector 112.

In an alternative embodiment, the detachable object is not secured to the mounting plate but directly to the chamber wall. Three spaced apart locating pins are provided which protrude from the chamber wall and co-operate with correspondingly sized bores in the detachable object. In order to provide good repeatability of positioning, the three locating pins provide six points of contact with the bores. For example, a first pin contacts a bore surface at three places, a second pin contacts an elliptically shaped bore at two points and a third pin contacts an oversized bore at one point.

In some circumstances, it may not be possible to conduct a visual alignment of the laser beam for example, when the chamber is sealed. In such circumstances, an alignment device 260 is provided. The alignment device assists in aligning the passage of a laser beam through the wall of the environmental chamber.

The alignment device 260 fits between the detachable object 40 and the mounting plate 242 (FIG. 6). The alignment device 260 houses a target 262 which is disposed at about 45° to the laser beam path. The target has two pairs of apertures 264a, 264b, 266a, 266b. One pair is coincident with the measurement beam 264a, 264b and one with the reference beam 266a, 266b when the beams are aligned (a pair is associated with each beam as it is a double pass interferometer system). The target 262 is disposed at 45° to the plane of the paper such that light which is incident on the target 262 is reflected through a side of the alignment device 260 and so can be viewed when the individual parts 232, 260, 242 are bolted together. If the beams are aligned then on the first pass through the system the beams pass through a first aperture 264a, 266a and on the second pass the beams pass through the second aperture 264b, 266b. If any of the beams are not aligned they will encounter the target 262 and be reflected through a side of the device. Rotation of a prism will deviate a laser beam passing therethrough in one plane enabling the beams to be aligned through the apertures 264a, 264b, 266a, 266b. Rotation of the wedge prisms 156, 158 (FIG. 4) deviates the laser beams in yaw (Z-direction) and pitch (Y-direction) respectively.

Once a laser beam is aligned, the alignment device is removed enabling direct contact between the detachable object and mounting plate. For clean environment processing, the chamber is baked out between each process cycle which causes distortions of the chamber wall. These distortions are not necessarily repeatable and so the alignment of the laser beam may require adjustment to re-optimise the alignment when re-attached to account for this. The tolerance between the surface of the detachable object which attaches to the chamber wall and the plane of a beam is ±0.02 mm per 76 mm to retain minimum signal strength for realignment.

In FIGS. 3 to 6, both the first and second passes of a beam and the measurement and reference beams have been illustrated as being vertically displaced from each other. In practice, the measurement and reference beams are vertically displaced but the double passes of each beam are displaced in a plane perpendicular to this i.e. into the plane of the paper.

The column interferometers shown in FIGS. 3 and 4 have a substantially fixed distance between the measurement and reference beams (subject to some deviation by rotation of the wedge prisms). In some circumstances, it may be desirable to change this distance without having to design a new system. For this reason, a further wedge prism 270 is provided in the protrusion 32, 232 of the detachable object 40. This prism 270 deviates the beam in the Y-direction (in the plane of the paper) causing either a reduction or an increase in the distance between the measurement and reference beams. For simplicity, this extra wedge prism 270 is fixed with respect to the beam that is acts on so produces a fixed change in angle between the beams.

The wedge prism 270 is alternatively located within the mounting plate 242.

In the interferometric system illustrated in FIGS. 3 and 4, the reflecting mirrors 22, 50, 122, 150 and the measurement 44, 144 and reference 48, 148 beams are substantially parallel to one another. In some circumstances, it may be not possible or not desirable to do this. In such circumstances, the mirror 50, 150 on the relatively fixed column may be mounted at an angle to the column 52, 152. In column interferometers of the type shown in FIGS. 3 and 4, the relatively fixed column can move with respect to the relatively movable sample stage however, the travel of the column is of the order of 40 times less than that of the sample stage. If the mirror 50, 150 is mounted at an angle to the column, the cosine error over the distance of travel of the column would be 2% for an angle of 10°. As the angle that the mirror 50, 150 subtends is increased, this error would also increase. If the mirror 22, 122 on the sample stage were angled, the error would be much greater over the range of travel of the sample stage which would probably result in too inaccurate results.

Laser interferometers according to the invention enable the measurement of distance to an object. This is achieved by directing a first laser beam 20, 44, 144 from a laser source 12, 112 to a reflector 22, 122 mounted on the object, directing a second laser beam along a reference path 16, 48, 148 wherein the second laser beam is provided from the first laser beam, superimposing the reflected first laser beam and the second laser beam after it has travelled along the reference path to produce an interference beam, detecting the interference beam, and calculating the relative change in positions of the object and detector.

Column laser interferometers according to the invention additionally enable the tracking of the orientation of a sample holder, or object. This is achieved by directing a first laser beam 44, 144 from a laser source 12, 112 to a reflector 22, 122 mounted on the sample holder, directing a second laser beam along a reference path 48, 148 wherein the second laser beam is provided from the first laser beam, superimposing the reflected first laser beam and second laser beam after it has travelled along the reference path to produce an interference beam, and detecting the interference beam, wherein at least one rotatable wedge 56, 58, 60, 156, 158 is positioned in the path of the first laser beam whereby rotation of the at least one rotatable wedge deviates the first laser beam in a plane and wherein a change in the orientation of the sample holder in the plane is tracked by a rotation of the at least one rotatable wedge.

Although the invention has been illustrated using a combined laser source and detector, this is not essential. In fact, it may be desirable to have a separate detector, mounted on a wall internal to the vacuum chamber with, for example, a fibre connection to the outside of the vacuum chamber.

FIG. 7 shows schematically a laser interferometer 300 having an alternative mounting arrangement. A detachable object 302 is removably mounted to a wall of a vacuum chamber 304 using two locators, for example dowel pints 306, which protrude from the wall of the vacuum chamber 306 and, which are housed within commensurately sized receiving chambers 308 located in the detachable object 302 when the detachable object 302 is mounted to the wall of the vacuum chamber 304.

The wall of the vacuum chamber 304 includes an optical window 310 which allows light from a laser mounted within the detachable object 302 to pass into the vacuum chamber.

An additional object 312 may be provided which, in use, is located between the detachable object 302 and the wall of the vacuum chamber 304. This additional object 312 may be an alignment device which includes targets (not shown) or can contain other equipment such as a beamsplitter and has an optical passage 314 which allows light from a laser located in the detachable object 302 to pass through the optical window 310 located in a wall of the vacuum chamber 304.

The additional object 312 includes two receiving chambers 318 designed to receive the dowel pins 306 which protrude from the wall of the vacuum chamber 304 and two machined control pins 316 designed to be housed within the receiving chambers 308 located in the detachable object 302. In the example shown, a portion of each of the two receiving chambers 318 of the additional object is formed within the machined control pins 316.

The use of two locators, in this case dowel pins optionally with machined control pins, provides a highly repeatable mounting. At least two locators are required to constrain the number of degrees of freedom of the joint sufficiently to provide a repeatable mounting.

The invention claimed is:

1. A laser interferometer comprising:
   a housing including a laser source, the housing having a mount; and
   a first reflector located within an environmental chamber, wherein the mount is configured such that the housing can be detached from and substantially repeatably mounted to a wall of the environmental chamber such that a laser beam from the laser source can pass through a light passage provided through the wall of the environmental chamber to the first reflector.

2. A laser interferometer according to claim 1, wherein the mount is a kinematic mount.

3. A laser interferometer according to claim 1, wherein the environmental chamber is a vacuum chamber.

4. A laser interferometer according to claim 1, wherein the first reflector is a mirror.

5. A laser interferometer according to claim 1, wherein the housing includes at least one beam steerer for adjusting a direction of the laser beam to pass through the light passage.

6. A laser interferometer according to claim 5, wherein the housing includes two beam steerers for adjusting the direction of the laser beam in two planes.

7. A laser interferometer according to claim 5 comprising an alignment device for aligning the laser beam to pass through the wall of the environmental chamber.

8. A laser interferometer according to claim 1, wherein the housing is mounted to the wall via at least two locators.

9. A laser interferometer according to claim 1 further comprising a second reflector that is relatively fixed and located within the environmental chamber such that a reference beam from the laser source can pass through the light passage to the second reflector.

10. A laser interferometer according to claim 9, wherein the housing includes a wedge prism for adjusting an angle between a measurement beam and the reference beam.

11. A laser interferometer comprising:
    a housing capable of being detached from and substantially repeatably mounted to a wall of an environmental chamber, the housing including a laser source; and
    a first reflector located within the environmental chamber, wherein a laser beam from the laser source can pass through a light passage provided through the wall of the environmental chamber to the first reflector.

12. A laser interferometer according to claim 11, wherein the housing is capable of being kinematically mounted to the wall.

13. A laser interferometer according to claim 1, wherein the mount allows for repeatable detection of a minimum laser beam signal necessary for alignment.

* * * * *